(12) United States Patent
Ok et al.

(10) Patent No.: US 12,317,764 B2
(45) Date of Patent: May 27, 2025

(54) UNIFORM VOLTAGE DROP IN ARRAYS OF MEMORY DEVICES

(71) Applicant: International Business Machines Corporation, Armonk, NY (US)

(72) Inventors: Injo Ok, Loudonville, NY (US); Soon-Cheon Seo, Glenmont, NY (US); Alexander Reznicek, Troy, NY (US); Youngseok Kim, Upper Saddle River, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/091,513

(22) Filed: Nov. 6, 2020

(65) Prior Publication Data

US 2022/0149275 A1 May 12, 2022

(51) Int. Cl.
*H10N 70/20* (2023.01)
*H01L 23/522* (2006.01)
(Continued)

(52) U.S. Cl.
CPC ..... *H10N 70/8413* (2023.02); *H01L 23/5228* (2013.01); *H10B 63/80* (2023.02); *H10D 1/474* (2025.01); *H10N 70/011* (2023.02); *H10N 70/231* (2023.02); *H10N 70/826* (2023.02); *H10N 70/8828* (2023.02);
(Continued)

(58) Field of Classification Search
CPC ... H01L 45/126; H01L 45/1233; H01L 45/06; H01L 45/144; H01L 45/1253; H01L 27/2463; H01L 28/20; H01L 28/24; H01L 23/647; H01L 23/5228; H01L 21/76807; H01L 21/76834; H10N 70/231; H10N 70/8413; H10B 63/80; H10B 99/10; H10D 1/47-476
See application file for complete search history.

(56) References Cited

U.S. PATENT DOCUMENTS 7,738,290 B2   6/2010   Nakai
8,513,576 B2   8/2013   Kim et al.
(Continued)

FOREIGN PATENT DOCUMENTS

CN   102379009 A   3/2012
CN   111146339 A   5/2020
(Continued)

OTHER PUBLICATIONS

International Search Report and Written Opinion for PCT/CN2021/124625 dated Jan. 24, 2022 (9 pages).
(Continued)

*Primary Examiner* — Yu Chen
(74) *Attorney, Agent, or Firm* — L. Jeffrey Kelly

(57) ABSTRACT

Arrays of PCM devices and techniques for fabrication thereof having an integrated resistor formed during heater patterning for uniform voltage drop amongst the PCM devices are provided. In one aspect, a PCM device includes: at least one PCM cell including a phase change material disposed on a heater; and at least one resistor in series with the at least one PCM cell, wherein the at least one resistor includes a same combination of materials as the heater. A memory array and a method of forming a PCM device are also provided.

24 Claims, 12 Drawing Sheets

(51) Int. Cl.
    *H10B 63/00*       (2023.01)
    *H10B 63/10*       (2023.01)
    *H10D 1/47*        (2025.01)
    *H10N 70/00*       (2023.01)
    *G11C 13/00*         (2006.01)
    *H01L 21/768*        (2006.01)
    *H01L 23/528*        (2006.01)
    *H01L 23/532*        (2006.01)

(52) U.S. Cl.
    CPC ...... *G11C 13/0004* (2013.01); *G11C 2213/77* (2013.01); *H01L 21/76807* (2013.01); *H01L 21/76834* (2013.01); *H01L 23/528* (2013.01); *H01L 23/53261* (2013.01)

(56) References Cited

U.S. PATENT DOCUMENTS

| | | | |
|---|---|---|---|
| 8,817,514 | B2 | 8/2014 | Samachisa et al. |
| 9,252,362 | B2 | 2/2016 | Pio |
| 9,917,104 | B1 | 3/2018 | Roizin et al. |
| 2005/0111247 | A1* | 5/2005 | Takaura ................ H10B 63/30 257/E27.004 |
| 2007/0046421 | A1* | 3/2007 | Gogineni ................ H01L 28/20 257/E21.004 |
| 2007/0133270 | A1 | 6/2007 | Jeong et al. |
| 2009/0027955 | A1* | 1/2009 | Koh ................ H10B 61/22 438/102 |
| 2009/0029534 | A1* | 1/2009 | Czubatyi ................ H01L 45/16 438/492 |
| 2009/0184306 | A1 | 7/2009 | Mathew et al. |
| 2009/0195217 | A1 | 8/2009 | Choi et al. |
| 2010/0197111 | A1* | 8/2010 | Seo ................ H01L 45/126 257/E21.135 |
| 2010/0258777 | A1 | 10/2010 | Li |
| 2012/0235111 | A1 | 9/2012 | Osano |
| 2014/0103284 | A1* | 4/2014 | Hsueh ................ H01L 45/145 257/4 |
| 2014/0264230 | A1 | 9/2014 | Borodulin et al. |
| 2015/0294970 | A1* | 10/2015 | Jakushokas ......... H01L 23/5228 257/533 |
| 2018/0375023 | A1* | 12/2018 | Song ................ H10B 63/84 |
| 2019/0131521 | A1* | 5/2019 | Morin ................ H01L 45/06 |
| 2019/0140176 | A1* | 5/2019 | Arnaud ............. G11C 13/0004 |
| 2020/0058706 | A1 | 2/2020 | El-Hinnawy et al. |
| 2020/0058851 | A1* | 2/2020 | El-Hinnawy ......... H01L 23/345 |
| 2021/0407906 | A1* | 12/2021 | Kang ................ H01L 45/04 |
| 2022/0149275 | A1 | 5/2022 | Ok |

FOREIGN PATENT DOCUMENTS

| | | |
|---|---|---|
| CN | 116584171 A | 8/2023 |
| DE | 112021004683 T5 | 7/2023 |
| EP | 2417601 B1 | 2/2012 |
| EP | 3483889 B1 | 6/2021 |
| GB | 2616152 A | 8/2023 |
| JP | 2012-523710 A | 10/2012 |
| JP | 2023547165 A | 11/2023 |
| TW | 200729462 A | 8/2007 |
| WO | 2009/029534 A1 | 3/2009 |
| WO | 2010/118302 A2 | 10/2010 |
| WO | WO-2010140210 A1 * | 12/2010 ......... H01L 27/2481 |
| WO | WO2011119158 A1 | 9/2011 |
| WO | WO2016028362 A2 | 2/2016 |
| WO | 2022095693 A1 | 5/2022 |

OTHER PUBLICATIONS

Translation of DE Office Action, dated Feb. 11, 2024, Application No. 112021004683.7, 13 pages.

Japan Patent Office, "Notice of Reasons for Refusal," Nov. 26, 2024, 12 Pages, JP Application No. 2023-524902.

* cited by examiner

UNIFORM VOLTAGE DROP IN ARRAYS OF MEMORY DEVICES

FIELD OF THE INVENTION

The present invention relates to arrays of memory devices such as phase change memory (PCM) devices, and more particularly, to arrays of PCM devices and techniques for fabrication thereof having an integrated resistor formed during heater patterning for uniform voltage drop amongst the PCM devices.

BACKGROUND OF THE INVENTION

Chalcogenides are an emerging class of electronic materials that exhibit switching, memory, logic, and processing functionality. One type of chalcogenide memory device utilizes the wide range of resistance values available for the active chalcogenide material as the basis of memory operation. Namely, each resistance value corresponds to a distinct structural state of the chalcogenide material. One or more of the states can be selected and used to define operational memory states.

Chalcogenide materials exhibit a crystalline state or phase, as well as an amorphous state or phase. Different structural states of a chalcogenide material differ with respect to the relative proportions of the crystalline phase and amorphous phase in a given volume or region of the chalcogenide material. The range of resistance values is bounded by a SET state and a RESET state of the chalcogenide material. The SET state is a low resistance structural state whose electrical properties are primarily controlled by the crystalline portion of the chalcogenide material. The RESET state is a high resistance structural state whose electrical properties are primarily controlled by the amorphous portion of the chalcogenide material.

Chalcogenide memory devices can be embodied in an array of resistive memory cells. However, when these memory cell arrays become large, there is a significant difference between the line resistance of the first memory cell and that of the last memory cell. This resistance difference can lead to a large voltage drop amongst the memory cells affecting read and write performance.

Thus, techniques for achieving a uniform voltage drop in cross-bar arrays of memory cells would be desirable.

SUMMARY OF THE INVENTION

The present invention provides arrays of PCM devices and techniques for fabrication thereof having an integrated resistor formed during heater patterning for uniform voltage drop amongst the PCM devices. In one aspect of the invention, a PCM device is provided. The PCM device includes: at least one PCM cell including a phase change material disposed on a heater; and at least one resistor in series with the at least one PCM cell, wherein the at least one resistor includes a same combination of materials as the heater.

In another aspect of the invention, a memory array is provided. The memory array includes: a set of first metal lines; a set of second metal lines; and PCM devices in between the set of first metal lines and the set of second metal lines, wherein each of the PCM devices includes a PCM cell including a phase change material disposed on a heater, and a resistor in series with the PCM cell, wherein the resistor includes a same combination of materials as the heater, and wherein the PCM cell is present at an intersection of the set of first metal lines and the set of second metal lines.

In yet another aspect of the invention, a method of forming a PCM device is provided. The method includes: concurrently forming a heater on a bottom electrode and a resistor from a same combination of materials; forming a phase change material on the heater; and forming a top electrode on the phase change material, wherein the bottom electrode, the heater, the phase change material and the top electrode form a PCM cell.

A more complete understanding of the present invention, as well as further features and advantages of the present invention, will be obtained by reference to the following detailed description and drawings.

DETAILED DESCRIPTION OF PREFERRED EMBODIMENTS

As provided above, large arrays of resistive memory cells, such as chalcogenide phase change memory (PCM) memory cells, can experience a significant resistance difference from the first memory cell to the last along a given metal line. This resistance difference can undesirably cause a significant voltage drop amongst the memory cells thereby affecting read and write performance.

Advantageously, provided herein are PCM memory cell arrays and techniques for fabrication thereof having an integrated series resistor that is formed during heater patterning (i.e., in the heater level) with a tunable length to provide uniform voltage drop amongst the PCM devices. As will be described in detail below, materials such as tantalum nitride (TaN), titanium nitride (TiN), silicon nitride (SiN), etc. are leveraged to enable a reduction in the series resistance area by an order or two which can provide a better process margin. In turn, the reduced resistor size provides better parasitic inductance and capacitance.

Figure 1:
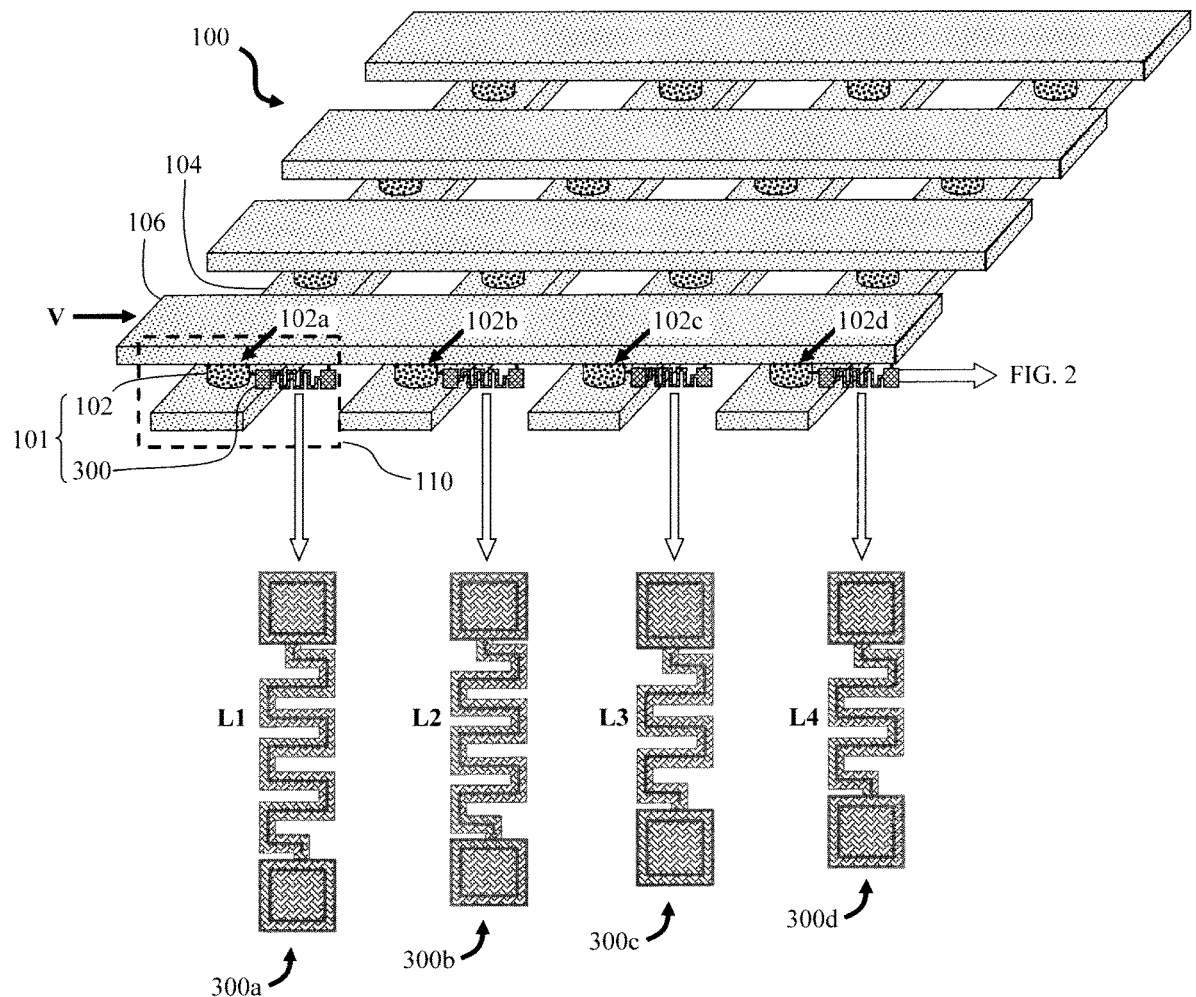
FIG. 1 is a diagram illustrating a memory array of phase change memory (PCM) devices, each PCM device including a PCM cell and an integrated series resistor according to an embodiment of the present invention.

FIG. 1 is a diagram illustrating a memory array 100 of PCM devices 101 in accordance with the present techniques. As shown in FIG. 1, each PCM device 101 includes a PCM cell 102 and an associated integrated series resistor 300. The PCM devices 101 are present between two sets of metal lines. Namely, memory array 100 includes first metal lines 104 present below PCM devices 101 and second metal lines 106 present above the PCM devices 101. In this exemplary embodiment, the first metal lines 104 are oriented orthogonal to the second metal lines 106. A PCM cell 102 is present at each intersection of the first metal lines 104 and the second metal lines 106.

Figure 2:
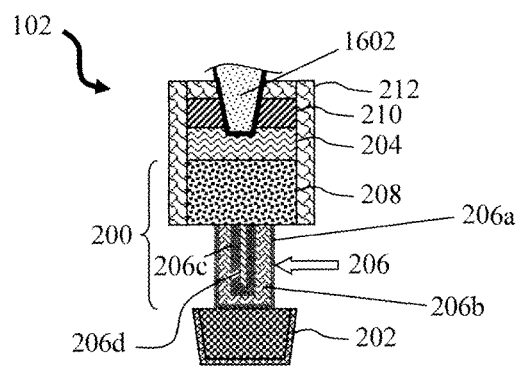
FIG. 2 is a cross-sectional diagram illustrating an exemplary PCM cell according to an embodiment of the present invention.

For illustrative purposes, a cross-sectional view of one of the PCM cells 102 is shown in FIG. 2. As shown in FIG. 2, each PCM cell 102 includes a PCM stack 200 sandwiched between a bottom electrode 202 and a top electrode 204. The PCM stack 200 has a heater 206 in direct physical contact with a phase change material 208. Namely, in the exemplary embodiment shown in FIG. 2, heater 206 is below the phase change material 208, such that the heater 206 is disposed on the bottom electrode 202, the phase change material 208 is disposed on the heater 206, and the top electrode 204 is disposed on the phase change material 208. With this configuration, the heater 206 may also be referred to herein as a 'bottom heater.'

As will be described in detail below, based on the present techniques, a hardmask 210 is disposed on the top electrode 204, and an encapsulation layer 212 is disposed on the PCM stack 200, the hardmask 210 and the top electrode 204. An interconnect 1602 (see also FIG. 16—described below) extends through the hardmask 210 and encapsulation layer 212 and is in direct physical contact with the top electrode 204. It is notable that certain structures that will be described in detail below are omitted in FIG. 2 solely for the purpose of clarity and ease of depiction. For instance, the surrounding dielectrics have been omitted.

A wide variety of materials can be employed as phase change material 208 in accordance with the present techniques. In the sense that it can exist in amorphous and crystalline form almost any material is a phase change material, such as metals, semiconductors or insulators. However, only a small group of materials has the properties that makes them technologically useful phase change materials, with high on/off resistance ratio, fast switching times and good data retention. According to an exemplary embodiment, phase change material 208 is a chalcogenide, i.e., phase change material 208 contains at least one chalcogenide element. Generally, chalcogenides are the elements in Group 16 of the periodic table of elements, e.g., sulfur (S), selenium (Se) and/or tellurium (Te). In one exemplary embodiment, phase change material 208 is a chalcogenide alloy that includes the element Te (chalcogen) in combination with at least one other element such as antimony (Sb) and/or germanium (Ge), forming the alloys $Sb_2Te_3$, GeTe and/or $Ge_2Sb_2Te_5$ (GST). However, the present techniques are not limited to the use of only chalcogenides as phase change material 208. For instance, alternatively phase change material 208 can include III-V semiconductor materials (such as gallium antimonide (GaSb)) and/or Ge—Sb based alloys. Additionally, elements such as silver (Ag), indium (In), nitrogen (N) and/or bismuth (Bi) can be added to phase change material 208 to optimize its properties.

During operation of memory array 100, heater 206 is employed to produce the heat (by resistive heating) used to switch phase change material 208 between two states, i.e., a low resistance crystalline state and a high resistance amorphous state. As shown in FIG. 2, the heater 206 is formed from a combination of materials alternating between a first material and a second material, e.g., a layer 206a of the first material, a layer 206b of the second material, a layer 206c of the first material, a layer 206d of the second material, etc. According to an exemplary embodiment, the first material is a relatively higher resistivity material(s) such as tantalum nitride (TaN) and/or silicon nitride (SiN), and the second material is a relatively lower resistivity material(s) such as such as titanium nitride (TiN). For instance, TaN and/or SiN provides increased resistance thereby enabling reduction of the series resistance area, while TiN provides good thermal conduction to the phase change material 208.

Further, as will be described in detail below, in accordance with the present techniques the heater 206 is formed concurrently with an integrated series resistor. To look at it another way, the series resistor is formed in the heater level during heater 206 patterning. Thus, the combination of first/second materials chosen should address both the need for resistive heating and heat conduction by the heater 206 to the phase change material 208, as well as provide the necessary resistance for the series resistor. As will become apparent from the description that follows, by forming the heater 206 concurrently with the integrated series resistor, the heater 206 and the integrated series resistor 300 include the same combination of the same materials.

Figure 3:
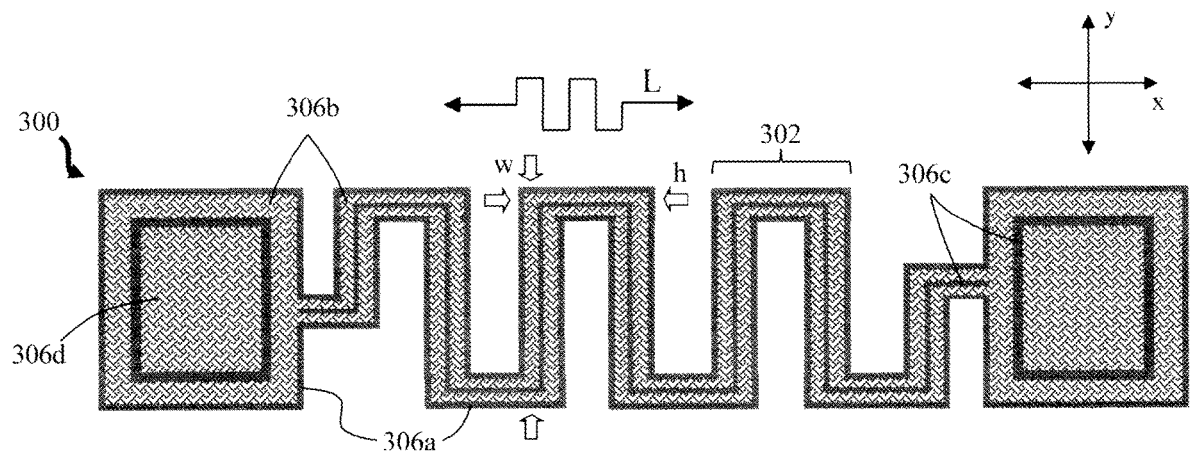
FIG. 3 is a top-down diagram illustrating an exemplary integrated series resistor according to an embodiment of the present invention.

For instance, a series resistor 300 formed in accordance with the present techniques is shown illustrated in FIG. 3. As shown in FIG. 3, like heater 206, resistor 300 is formed from a combination of materials alternating between the first material (such as TaN and/or SiN) and the second material (such as TiN), e.g., a layer 306a of the first material, a layer 306b of the second material, a layer 306c of the first material, a layer 306d of the second material, etc.

As will become apparent from the description below, a resistor 300 is associated with each of the PCM cells 102. Namely, a resistor 300 connects each of PCM cells 102 in series with one of the metal lines 106. According to an exemplary embodiment, resistor 300 has a serpentine shape as shown in FIG. 3, whereby at least a portion of resistor 300 loops back and forth along the x- and y-directions. Employing such a serpentine configuration advantageously enables a reduction of the series resistance area.

Further, as highlighted above, resistor 300 has a tunable length to provide uniform voltage drop amongst the PCM cells 102. For instance, during patterning, a length L of resistor 300 can be varied to vary the resistance of the resistor 300 for a corresponding PCM cell 102. Increasing the length L of resistor 300 increases the resistance of resistor 300, and vice versa. By way of example only, referring to FIG. 3, the length L of resistor 300 can be increased/decreased by increasing/decreasing the number of loops 302 in resistor 300 and/or increasing/decreasing the width w and/or height h of the loops 302. Each of these techniques will increase/decrease the length of the path along which a programming voltage has to travel to get from the corresponding metal line 106 to the PCM cell 102.

In general, the length L chosen for the resistors 300 will depend on the position of the PCM devices 101 and corresponding PCM cells 102 in the memory array 100. For instance, referring back to FIG. 1, locating the PCM cells 102 along a particular metal line 106 naturally will position some PCM cells 102 closer to the programming voltage source V than others. With conventional array designs, there is a significant difference between the line resistance of the cell closest to the voltage source V and that of the cell farthest away from the voltage source V. As a result, a voltage drop is often experienced amongst the cells which can affect read and write performance.

Advantageously, with the present techniques, the series resistors 300 with variable length and hence variable resistivity are employed to tune the resistance of the PCM devices 101 as a function of their distance from the voltage source V. Thereby, a uniform voltage drop can be engineered amongst the PCM devices 101 and PCM cells 102. For instance, referring to FIG. 1, PCM cells 102a,b,c,d are located along the same metal line 106 with PCM cell 102a located closest to the voltage source V, PCM cell 102d located farther away from the voltage source V, and PCM cells 102b,c positioned in between PCM cell 102a and PCM cell 102d. Series resistors 300a,b,c,d of varying lengths L1, L2, L3 and L4 connect PCM cells 102a,b,c,d, respectively, to metal line 106. According to an exemplary embodiment, L1>L2>L3>L4. In that case, the resistances of resistors 300a>300b>300c>300d, respectively. To look at it another way, the resistance is tuned (via the lengths of resistors 300a,b,c,d) to gradually decrease the farther away the PCM cells 102a,b,c,d are from the voltage source. By way of this tunable process, an equivalent resistance can be produced at each of the PCM cells 102a,b,c,d, thereby unifying the voltage drops amongst the PCM cells 102a,b,c,d during operation.

An exemplary methodology for fabricating a PCM device having integrated series resistors formed during heater patterning is now described by way of reference to FIGS. 4-18. FIGS. 4-18 depict cross-sectional cuts and top-down views of a section 110 (see FIG. 1) of memory array 100 encompassing one of the PCM devices 101 (i.e., a PCM cell 102 and associated integrated series resistor 300). Further, as will become apparent from the description that follows, FIG. 1 provides a basic illustration of the components such as the PCM cells 102, integrated series resistors 300 and the corresponding metal lines 104 and 106, without depicting the surrounding structures such as dielectrics, interconnects, etc. This is done merely for ease and clarity of depicting these elements of the present techniques. However, the structures not shown in FIG. 1, are shown and described in detail in the figures and description that follows. Also, as will be described in detail below, the integrated series resistors 300 are formed concurrently with, and adjacent to, the heaters 206 of the PCM cells 102. Thus, the placement of the integrated series resistors 300 in FIG. 1 is merely to illustrate that the integrated series resistors 300 are connected in series between the PCM cells 102 and the metal lines 106, and that the integrated series resistors 300 can have a varied length. It is not meant to imply that the integrated series resistors 300 are necessarily oriented in this manner.

Figure 4:
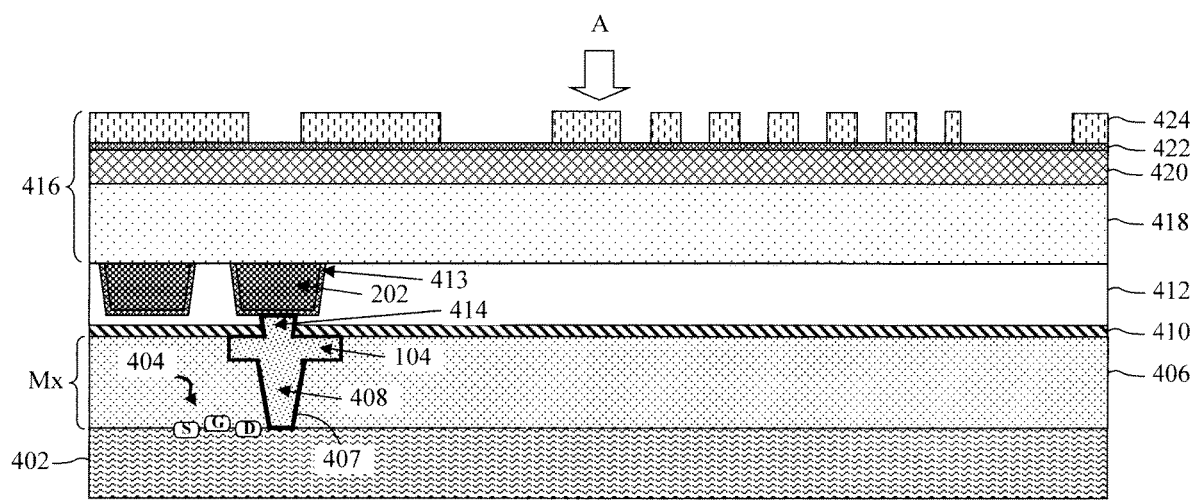
FIG. 4 is a cross-sectional diagram illustrating a first metal layer Mx including a first metal line in a interlayer dielectric (ILD) having been formed on a substrate, at least one bottom electrode having been formed in a second ILD over the first metal line, and a lithography stack including a hardmask layer, an organic planarizing layer (OPL), an antireflective coating (ARC) and a patterned photoresist having been formed on the second ILD according to an embodiment of the present invention.

As shown in FIG. 4, the process begins with the formation of a first metal layer Mx on a substrate 402. According to an exemplary embodiment, substrate 402 is a bulk semiconductor wafer, such as a bulk silicon (Si), bulk germanium (Ge), bulk silicon germanium (SiGe) and/or bulk III-V semiconductor wafer. Alternatively, substrate 402 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor. Substrate 402 may already have pre-built structures such as transistors, diodes, capacitors, resistors, interconnects, wiring, etc. See, for example, selector transistor 404. Each transistor includes a channel interconnecting a source (S) and a drain (D), and a gate (G) that regulates electron flow through the channel.

To form the first metal layer Mx, an interlayer dielectric (ILD) 406 is first deposited onto substrate 402. Suitable ILD 406 materials include, but are not limited to, nitride materials such as silicon nitride (SiN) and/or oxide materials such as silicon oxide (SiOx) and/or organosilicate glass (SiCOH) and/or ultralow-κ interlayer dielectric (ULK-ILD) materials, e.g., having a dielectric constant κ of less than 2.7. By comparison, silicon dioxide ($SiO_2$) has a dielectric constant κ value of 3.9. Suitable ultralow-κ dielectric materials include, but are not limited to, porous organosilicate glass (pSiCOH). A process such as chemical vapor deposition (CVD), atomic layer deposition (ALD) or physical vapor deposition (PVD) can be employed to deposit ILD 406 onto substrate 402.

A metallization process is then employed to form a first metal line 104 in ILD 406. As described in conjunction with the description of FIG. 1 above, first metal lines 104 are present in memory array 100 below the PCM cells 102. It is noted that like structures are numbered alike in the description and figures. In the exemplary embodiment shown illustrated in FIG. 4, a conductive via 408 connects metal line 104 to transistor 404. By way of example only, a so called 'dual damascene process' can be employed to form metal line 104 and conductive via 408. In general, a dual damascene process involves first patterning features such as a trench and/or a via in a dielectric, and then filling the features with a metal or combination of metals to form metal lines and/or conductive vias, respectively. When the trench is formed before the via, it is also referred to herein as a trench-first dual damascene process. Conversely, when the via is formed before the trench, it is also referred to herein as a via-first dual damascene process.

Suitable metal(s) for metal line 104 and conductive via 408 include, but are not limited to, copper (Cu), cobalt (Co), ruthenium (Ru) and/or tungsten (W). A process such as evaporation, sputtering or electrochemical plating can be employed to deposit the metal(s) into the features. Following deposition, the metal overburden can be removed using a process such as chemical-mechanical polishing (CMP). Prior to depositing the metal(s) into the features, a conformal barrier layer 407 can be deposited into and lining the features. Use of such a barrier layer helps to prevent diffusion of the metal(s) into the surrounding dielectric. Suitable barrier layer materials include, but are not limited to, tantalum (Ta), tantalum nitride (TaN), titanium (Ti), and/or titanium nitride (TiN). Additionally, a seed layer (not shown) can be deposited into and lining the features prior to contact metal deposition. A seed layer facilitates plating of the metal(s) into the features.

The heater 206 and integrated series resistor 300 are then formed over the first metal layer Mx. As provided above, the heater 206 is disposed on a bottom electrode 202. To form the bottom electrode 202, a capping layer 410 is deposited onto ILD 406, an ILD 412 is deposited onto the capping layer 410, and at least one bottom electrode 202 is formed in the ILD 412 over the metal line 104. See FIG. 4. Suitable materials for the capping layer 410 include, but are not limited to, nitride materials such as SiN, silicon oxynitride (SiON) and/or silicon oxycarbonitride (SiOCN). A process such as CVD, ALD or PVD can be employed to deposit the capping layer 410 onto the ILD 406. According to an exemplary embodiment, capping layer 410 has a thickness of from about 2 nanometers (nm) to about 5 nm and ranges therebetween.

ILD 412 may also be referred to herein as the 'second ILD' so as to distinguish it from ILD 406 which may also be referred to herein as the 'first ILD.' Suitable materials for ILD 412 include, but are not limited to, oxide materials such as SiOx and/or SiCOH and/or ULK-ILD materials such as pSiCOH. A process such as CVD, ALD or PVD can be employed to deposit ILD 412 onto the capping layer 410.

A metallization process is then employed to form at least one bottom electrode 202 in the ILD 412 over the metal line 104. In the exemplary embodiment shown illustrated in FIG. 4, a conductive via 414 connects bottom electrode 202 to metal line 104. By way of example only, bottom electrode 202 and conductive via 414 can be formed using a dual damascene process. As provided above, a dual damascene process involves first patterning features such as a trench and/or a via in a dielectric, and then filling the features with a metal or combination of metals (e.g., Cu, Co, Ru and/or W) using a process such as evaporation, sputtering or electrochemical plating to form metal lines and/or conductive vias, respectively. Following deposition, the metal overburden can be removed using a process such as CMP. Prior to depositing the metal(s) into the features, a conformal barrier layer 413 (e.g., Ta, TaN, Ti and/or TiN) can be deposited into and lining the features to prevent diffusion of the metal(s) into the surrounding dielectric. Additionally, a seed layer (not shown) can be deposited into and lining the features prior to contact metal deposition to facilitate plating of the metal(s) into the features.

To pattern the heater 206 and integrated series resistor 300, a lithography stack 416 is next formed on the ILD 412 over the at least one bottom electrode 202. As shown in FIG. 4, the lithography stack 416 includes a hardmask layer 418 (e.g., SiN), an organic planarizing layer (OPL) 420 disposed on the hardmask layer 418, an antireflective coating (ARC) 422 disposed on the OPL 420, and a patterned photoresist 424 disposed on the ARC 422.

Figure 5:
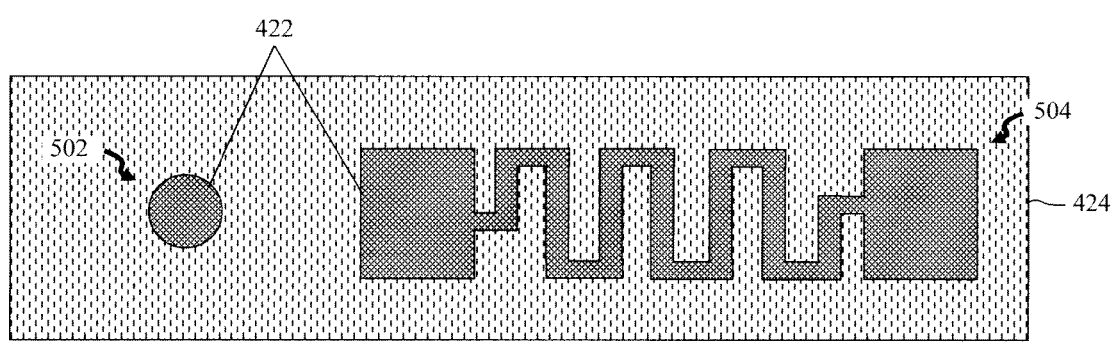
FIG. 5 is a top-down diagram illustrating the patterned photoresist having been patterned with the footprint and location of the heater and integrated series resistor according to an embodiment of the present invention.
Figure 6:
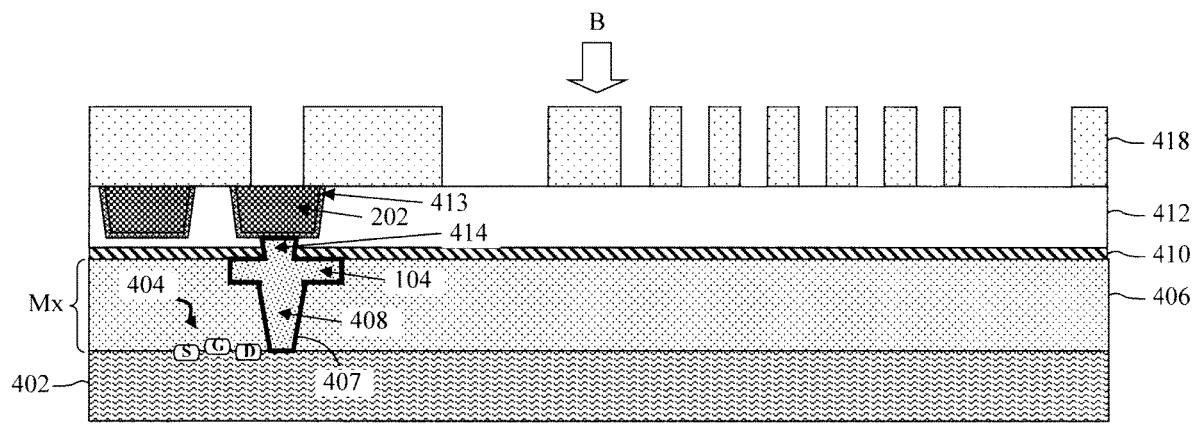
FIG. 6 is a cross-sectional diagram illustrating the pattern from the patterned photoresist having been transferred to the hardmask layer according to an embodiment of the present invention.

Photoresist 424 is patterned with the footprint and location of the heater 206 and integrated series resistor 300. For instance, as shown in FIG. 5 (a top-down view of the structure from view point A—see FIG. 4), photoresist 422 contains a pattern 502 corresponding to the footprint and location of the heater 206, and pattern 504 corresponding to the footprint and location of the integrated series resistor 300.

Lithography and etching techniques are then employed to transfer the pattern 502/504 from photoresist 424 to the hardmask layer 418, after which any remaining OPL 420, ARC 422 and photoresist 424 are removed. See FIG. 6. A directional (anisotropic) etching process such as reactive ion etching (RIE) can be employed to pattern the hardmask layer 418.

Figure 7:
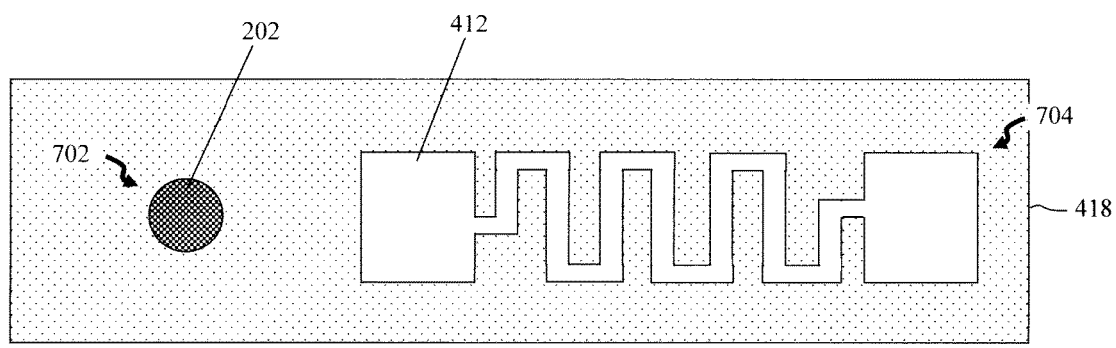
FIG. 7 is a top-down diagram illustrating the hardmask layer containing a (first) pattern corresponding to the footprint and location of the heater, and a (second) pattern corresponding to the footprint and location of the integrated series resistor according to an embodiment of the present invention.

Hardmask layer 418 is now patterned with the footprint and location of the heater 206 and integrated series resistor 300. For instance, as shown in FIG. 7 (a top-down view of the structure from view point B—see FIG. 6), hardmask layer 418 contains a (first) pattern 702 corresponding to the footprint and location of the heater 206, and (second) pattern 704 corresponding to the footprint and location of the integrated series resistor 300.

According to the exemplary embodiment, the heater 206 and the integrated series resistor 300 are formed from a same combination of materials alternating between the first material and the second material. As highlighted above, the first material is preferably a relatively higher resistivity material(s) such as TaN and/or SiN, and the second material is preferably a relatively lower resistivity material(s) such as TiN. For instance, referring to FIG. 8, a layer 802 of the first material is conformally deposited onto the hardmask layer 418, lining the pattern 702/704. According to an exemplary embodiment, layer 802 has a thickness of from about 2 nanometers (nm) to about 10 nm and ranges therebetween. A layer 804 of the second material is then deposited conformally onto layer 802. According to an exemplary embodiment, layer 804 has a thickness of from about 2 nm to about 10 nm and ranges therebetween. A layer 806 of the first material is conformally deposited onto layer 804, over layer 802. According to an exemplary embodiment, layer 806 has a thickness of from about 2 nm to about 10 nm and ranges therebetween. Finally, a layer 808 of the second material is deposited onto layer 806 filling the remainder of the pattern 702 and/or 704. A process such as CVD, ALD or PVD can be employed to deposit each of layers 802, 804, 806 and 808.

Figure 8:
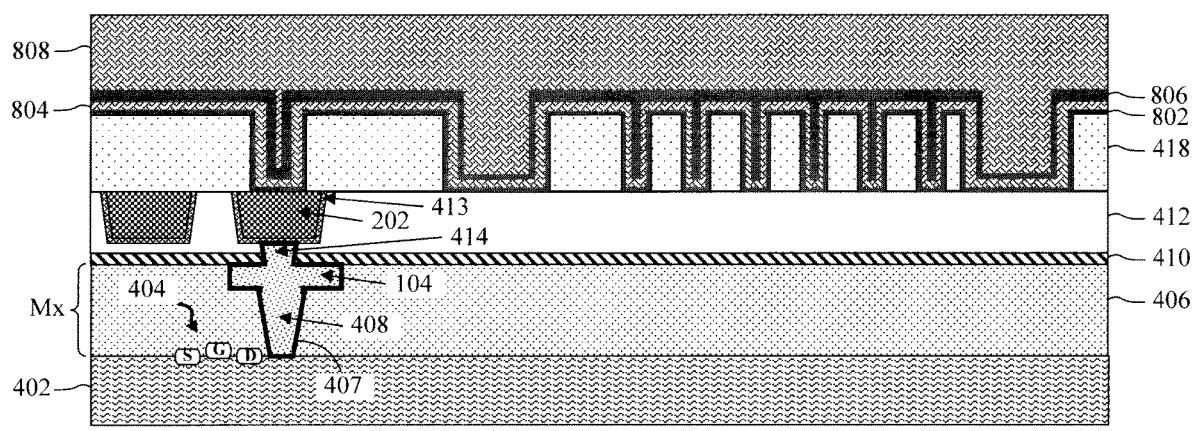
FIG. 8 is a cross-sectional diagram illustrating a same combination of materials alternating between layers of a first material and a second material having been concurrently deposited into the first pattern and the second pattern according to an embodiment of the present invention.

It is notable that the combination of first/second materials shown in FIG. 8 is merely one exemplary embodiment for forming the heater 206 and integrated series resistor 300 in accordance with the present techniques, and other configurations are contemplated herein. For example, one or more of the layers 802, 804, 806 and 808 can be eliminated from the design in order to reduce production complexity. Further, due to the build-up in thickness of the deposited layers 802-808, portions of the pattern 702 and the pattern 704 may become completely filled prior to the deposition of a subsequent layer. For instance, according to an alternative embodiment, the layer 806 of the first material might instead fill the remainder of the pattern 702 prior to deposition of the layer 808 of the second material. In that case, following polishing (see below), heater 206 will not include the layer 808 of the second material.

Figure 9:
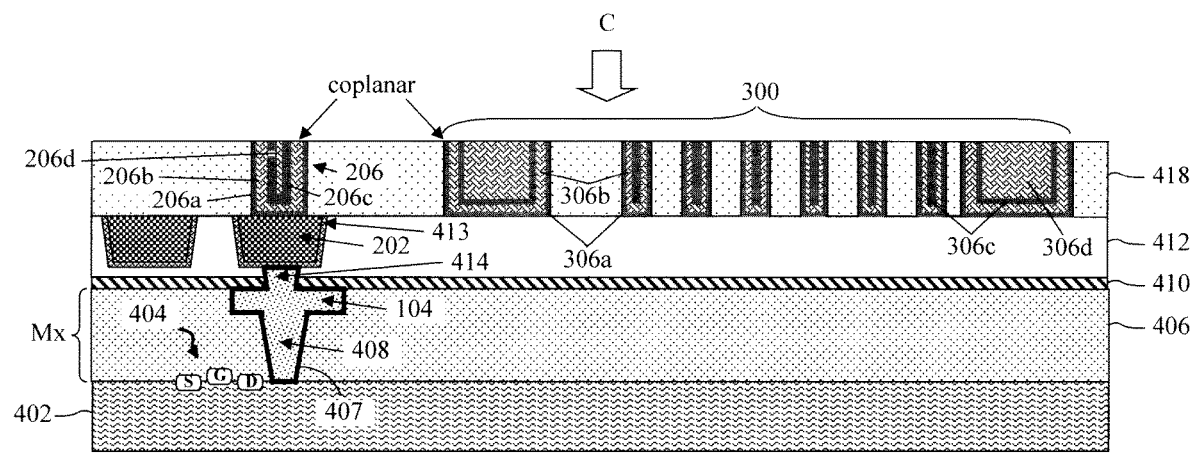
FIG. 9 is a cross-sectional diagram illustrating the layers of the first material and the second material having been polished to form the heater and the integrated series resistor according to an embodiment of the present invention.

A process such as chemical-mechanical polishing (CMP) is then used to polish the layers 802, 804, 806 and 808 down to hardmask layer 418. See FIG. 9. As shown in FIG. 9, polishing of the layers 802, 804, 806 and 808 separately defines the heater 206 and integrated series resistor 300. For consistency with the numbering use above, the portions of layers 802, 804 and 806 that form heater 206 are labeled 206a, 206b, 206c, 206d, respectively, and the portions of layers 802, 804, 806 and 808 that form integrated series resistor 300 are labeled 306a, 306b, 306c and 306d, respectively. Notably, as is now apparent from the above-described process, heater 206 and integrated series resistor 300 are formed from the same combination of the same (first and second) materials. Further, as shown in FIG. 9, the process results in the top surface of the heater 206 and the top surface of the integrated series resistor 300 being coplanar.

Figure 10:
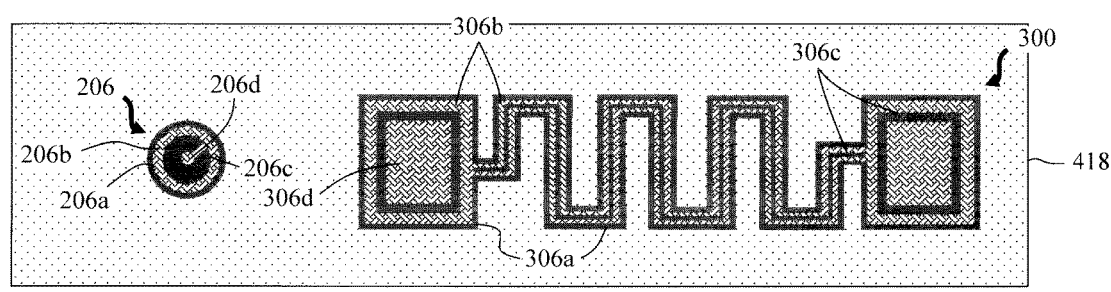
FIG. 10 is a top-down diagram illustrating the heater and the integrated series resistor having been defined according to an embodiment of the present invention.
Figure 11:
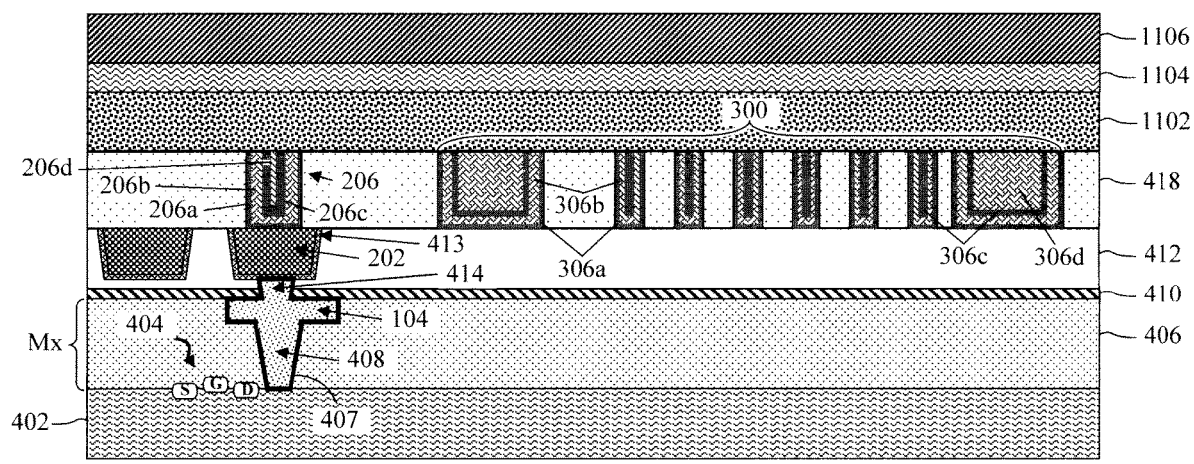
FIG. 11 is a cross-sectional diagram illustrating a phase change material layer having been deposited onto the hardmask layer, a top electrode layer having been deposited onto the phase change material layer, and a (second) hardmask layer having been deposited onto the top electrode layer according to an embodiment of the present invention.

FIG. 10 is a top-down view of the structure (from view point C—see FIG. 9). As shown in FIG. 10, heater 206 and integrated series resistor 300 are now defined. Based on the configuration of layers 802, 804, 806 and 808, heater 206 includes a layer 206a of the first material, a layer 206b of the second material, a layer 206c of the first material, and a layer 206d of the second material, and integrated series resistor 300 includes a layer 306a of the first material, a layer 306b of the second material, a layer 306c of the first material, and a layer 306d of the second material.

The remainder of PCM cell 102 is then built on top of the heater 206. To do so, a phase change material layer 1102 is deposited onto the hardmask layer 418 over the heater 206 and integrated series resistor 300, a top electrode layer 1104 is deposited onto the phase change material layer 1102, and a hardmask layer 1106 is deposited onto the top electrode layer 1104. See FIG. 11. Hardmask layer 1106 may also be referred to herein as a 'second hardmask layer' so as to distinguish it from 'first' hardmask layer 418.

According to an exemplary embodiment, phase change material layer 1102 is formed from a chalcogenide material, i.e., phase change material layer 1102 contains at least one chalcogenide element such as S, Se and/or Te. In one exemplary embodiment, phase change material layer 1102 is formed from a chalcogenide alloy that includes the element Te (chalcogen) in combination with at least one other element such as Sb and/or Ge, forming the alloys $Sb_2Te_3$, GeTe and/or $Ge_2Sb_2Te_5$. However, as highlighted above, the present techniques are not limited to the use of only chalcogenide phase change materials. For instance, according to an alternative embodiment, phase change material layer 1102 is formed from a III-V semiconductor material (such as gallium antimonide (GaSb)) and/or a Ge—Sb based alloy. Additional elements such as Ag, In, N and/or Bi can optionally be added to the phase change material to optimize its properties. A process such as CVD, PVD, or molecular beam epitaxy (MBE) can be employed to deposit the phase change material layer 1102 onto the hardmask layer 418. Naturally, the specific targets (PVD) or precursors (CVD) for the deposition process depend on the particular phase change material being formed. For example, when PVD is used to deposit $Ge_2Sb_2Te_5$ the most common source is a $Ge_2Sb_2Te_5$ target. Separate elemental Ge, Sb and Te targets can also be used by adjusting the flux from each target to obtain the desired composition. According to an exemplary embodiment, phase change material layer 1102 has a thickness of from about 10 nm to about 20 nm and ranges therebetween.

Suitable materials for the top electrode layer 1104 include, but are not limited to, TiN, TaN, Ru and/or W. A process such as evaporation or sputtering can be employed to deposit the top electrode layer 1104 onto the phase change material layer 1102. According to an exemplary embodiment, the top electrode layer 1104 has a thickness of from about 5 nm to about 10 nm and ranges therebetween.

Suitable materials for hardmask layer 1106 include, but are not limited to, nitride hardmask materials such as SiN. A process such as CVD, ALD or PVD can be employed to deposit the hardmask layer 1106 onto the top electrode layer 1104. According to an exemplary embodiment, the hardmask layer 1106 has a thickness of from about 5 nm to about 15 nm and ranges therebetween.

Figure 12:
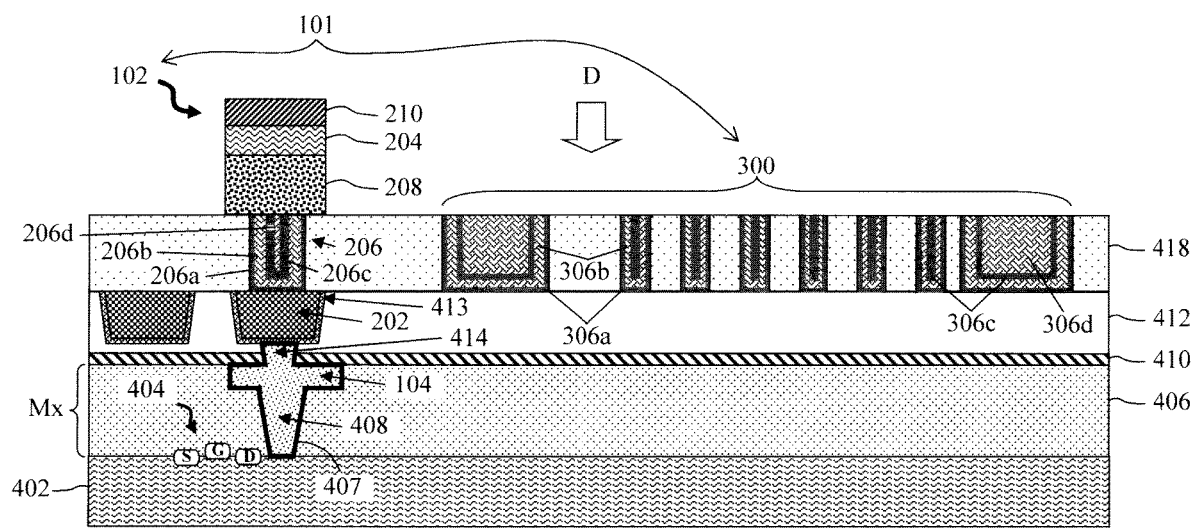
FIG. 12 is a cross-sectional diagram illustrating the second hardmask layer, the top electrode layer and the phase change material layer having been patterned to form a PCM cell according to an embodiment of the present invention.

Lithography and etching techniques are then used to pattern the hardmask layer 1106, the top electrode layer 1104 and the phase change material layer 1102. See FIG. 12. As described above, a lithography process generally involves the formation of a lithographic stack (e.g., OPL/ARC/photoresist), pattern transfer from the photoresist, etc. For brevity, description of the steps related to the formation and patterning of the lithographic stack is not repeated here, with the understanding that these steps are performed in the same manner as described above. As shown in FIG. 12, the patterned portion of the hardmask layer 1106 forms hardmask 210 with the footprint and location of the PCM cell 102. In the same manner as described above, hardmask 210 is then used to pattern the underlying phase change material layer 1102 and the top electrode layer 1104 to form the phase change material 208 and the top electrode 204, respectively, of PCM cell 102. As highlighted above, and as shown in FIG. 12, PCM cell 102 and integrated series resistor 300 together form a PCM device 101.

Figure 13:
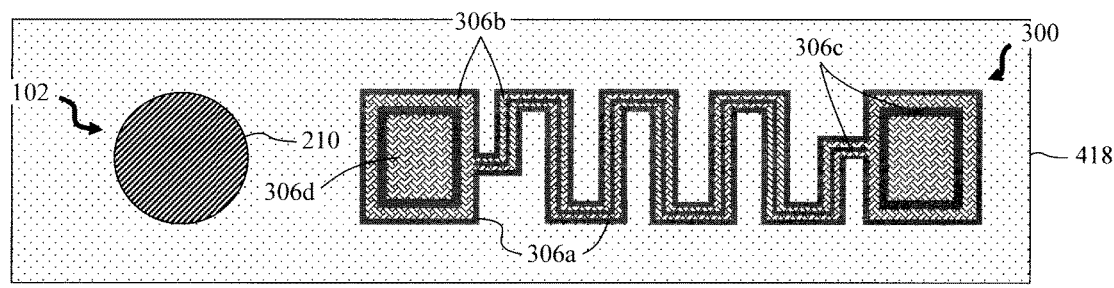
FIG. 13 is a top-down diagram illustrating the PCM cell present over the heater, and the integrated series resistor present adjacent to the PCM cell according to an embodiment of the present invention.
Figure 14:
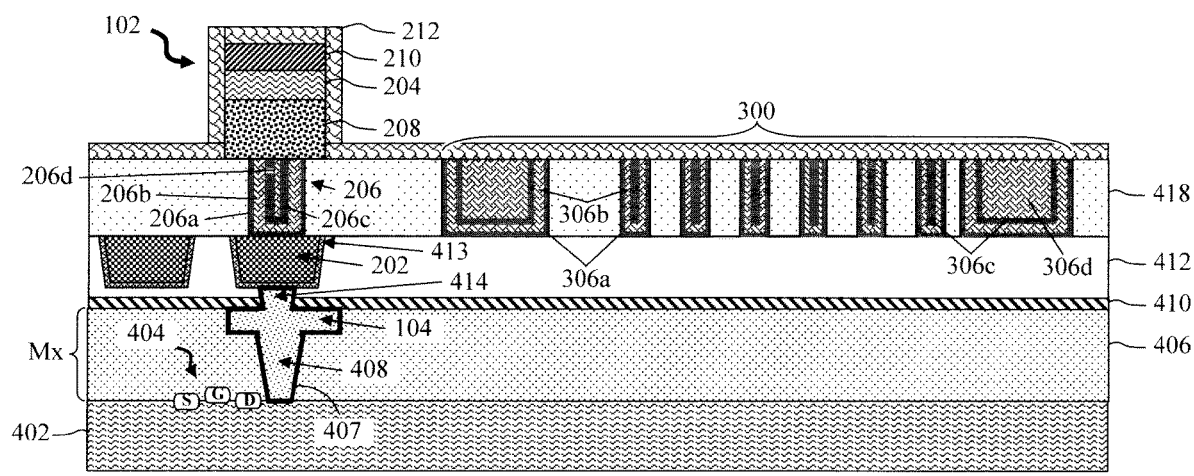
FIG. 14 is a cross-sectional diagram illustrating a conformal encapsulation layer having been deposited over the PCM cell and integrated series resistor according to an embodiment of the present invention.
Figure 15:
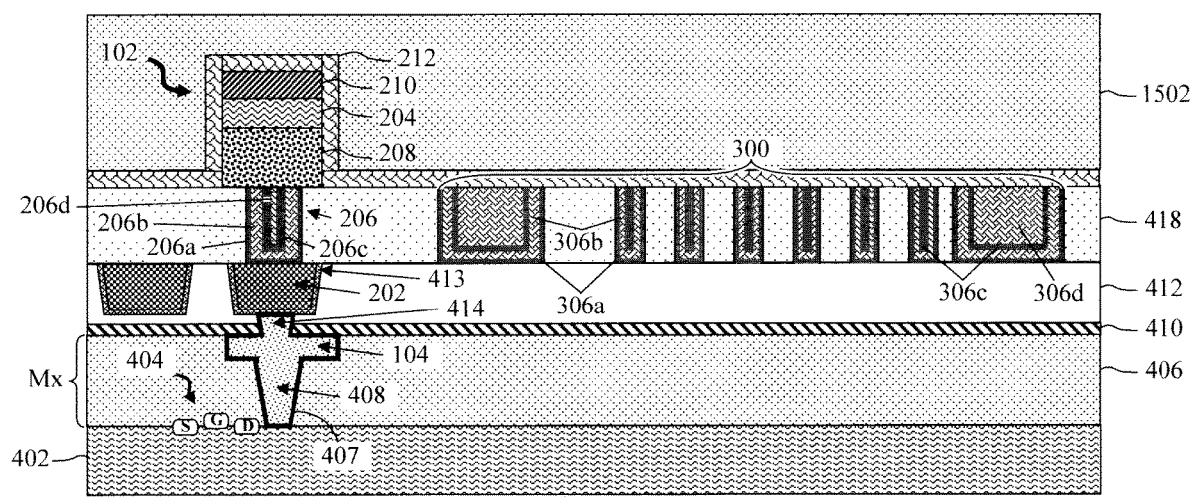
FIG. 15 is a cross-sectional diagram illustrating a third ILD having been deposited onto the encapsulation layer, burying the PCM cell and the integrated series resistor according to an embodiment of the present invention.

FIG. 13 is a top-down view of the structure (from view point D—see FIG. 12). As shown in FIG. 13, PCM cell 102 (of which only the hardmask 210 is visible from the top-down view) is now present over the heater 206 (not visible in the top-down view). Integrated series resistor 300 is present adjacent to the PCM cell 102 (and underlying heater 206).

A conformal encapsulation layer 212 is then deposited onto hardmask layer 418 and over PCM cell 102 and integrated series resistor 300. See FIG. 14. Encapsulation layer 212 serves to protect the exposed surfaces of the phase change material 208, such as along the sidewalls of PCM cell 102. Suitable materials for encapsulation layer 212 include, but are not limited to, nitride materials such as SiN, SiON and/or SiOCN. A process such as CVD, ALD or PVD can be employed to deposit the encapsulation layer 212.

According to an exemplary embodiment, encapsulation layer 212 has a thickness of from about 2 nm to about 5 nm and ranges therebetween.

A second metal layer Mx+1 is next fabricated over the hardmask layer 418 interconnecting the PCM cell 102 with integrated series resistor 300, and providing means for accessing the integrated series resistor 300 by the metal lines 106. To form the second metal layer Mx+1, an ILD 1502 is first deposited onto the encapsulation layer 212, burying PCM cell 102 and integrated series resistor 300. See FIG. 15. ILD 1502 may also be referred to herein as the 'third ILD' so as to distinguish it from 'first' ILD 406 and 'second' ILD 412. Suitable materials for ILD 1502 include, but are not limited to, oxide materials such as SiOx and/or SiCOH and/or ULK-ILD materials such as pSiCOH. A process such as CVD, ALD or PVD can be employed to deposit ILD 1502 onto the encapsulation layer 212. Following deposition, ILD 1502 is polished using a process such as CMP.

A metallization process is then employed to form at least a first interconnect 1602 and a second interconnect 1604 in ILD 1502. See FIG. 16. By way of example only, interconnects 1602 and 1604 can be formed using a dual damascene process. As provided above, a dual damascene process involves first patterning features such as a trench and/or a via, and then filling the features with a metal or combination of metals (e.g., Cu, Co, Ru and/or W) using a process such as evaporation, sputtering or electrochemical plating to form metal lines and/or conductive vias, respectively. In this case, the features are patterned in ILD 1502 as well as encapsulation layer 212 and, in the case of interconnect 1602, also through the hardmask 210 at the top of PCM cell 102. Following deposition, the metal overburden can be removed using a process such as CMP. Prior to depositing the metal(s) into the features, a conformal barrier layer 1601 (e.g., Ta, TaN, Ti and/or TiN) can be deposited into and lining the features to prevent diffusion of the metal(s) into the surrounding dielectric. Additionally, a seed layer (not shown) can be deposited into and lining the features prior to contact metal deposition to facilitate plating of the metal(s) into the features.

Figure 16:
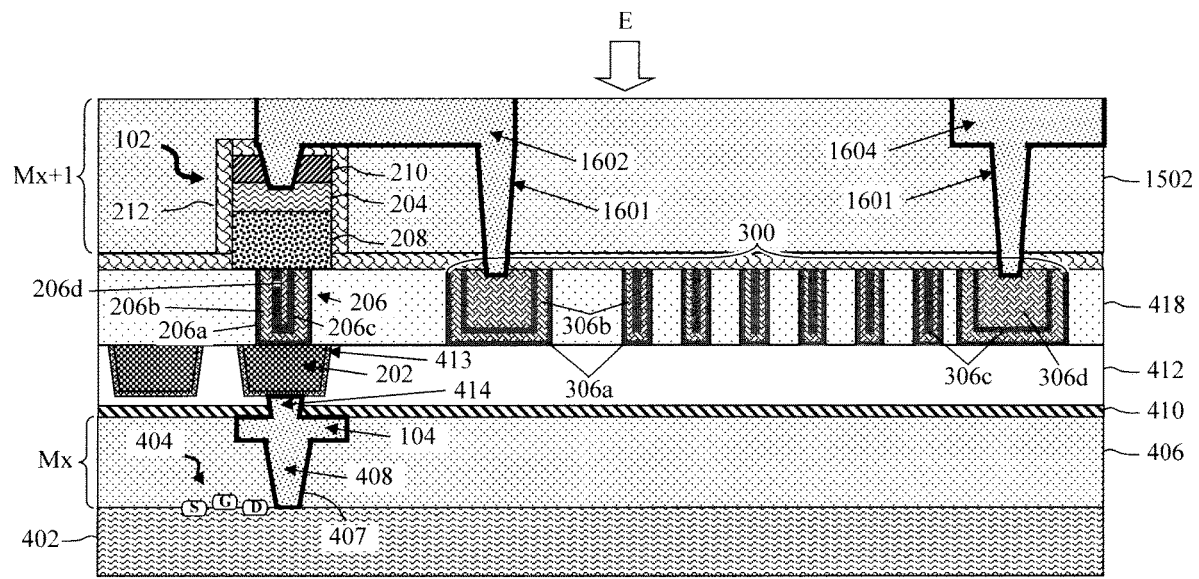
FIG. 16 is a cross-sectional diagram illustrating a first interconnect and a second interconnect of a second metal layer Mx+1 having been formed in the third ILD, whereby the first interconnect interconnects the PCM cell to the integrated series resistor, and the second interconnect contacts an opposite end of the integrated series resistor and will serve to interconnect the integrated series resistor to a second metal line according to an embodiment of the present invention.

As shown in FIG. 16, interconnect 1602 contacts both the PCM cell 102 (via top electrode 204) and one (first) end of integrated series resistor 300. Thus, interconnect 1602 interconnects PCM cell 102 to integrated series resistor 300. Interconnect 1604 contacts another (second) end of integrated series resistor 300 (opposite the first end). As will be described in detail below, interconnect 1604 will serve to interconnect the integrated series resistor 300 to metal lines 106.

Figure 17:
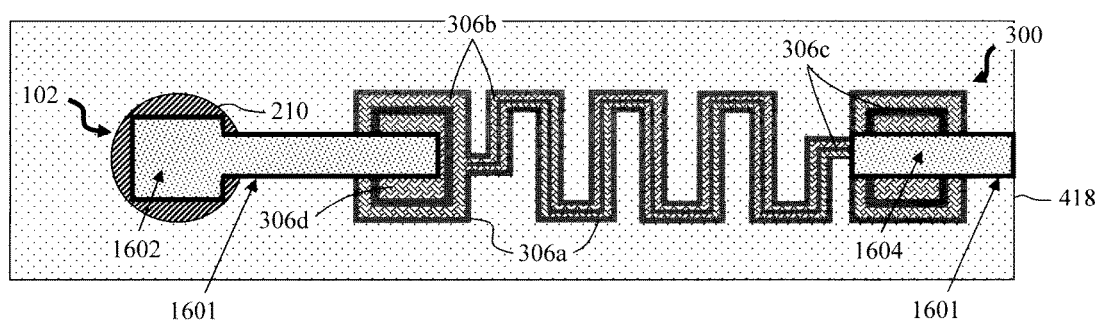
FIG. 17 is a top-down diagram illustrating the first interconnect interconnecting the PCM cell to the integrated series resistor, and the second interconnect contacting an opposite end of the integrated series resistor according to an embodiment of the present invention.
Figure 18:
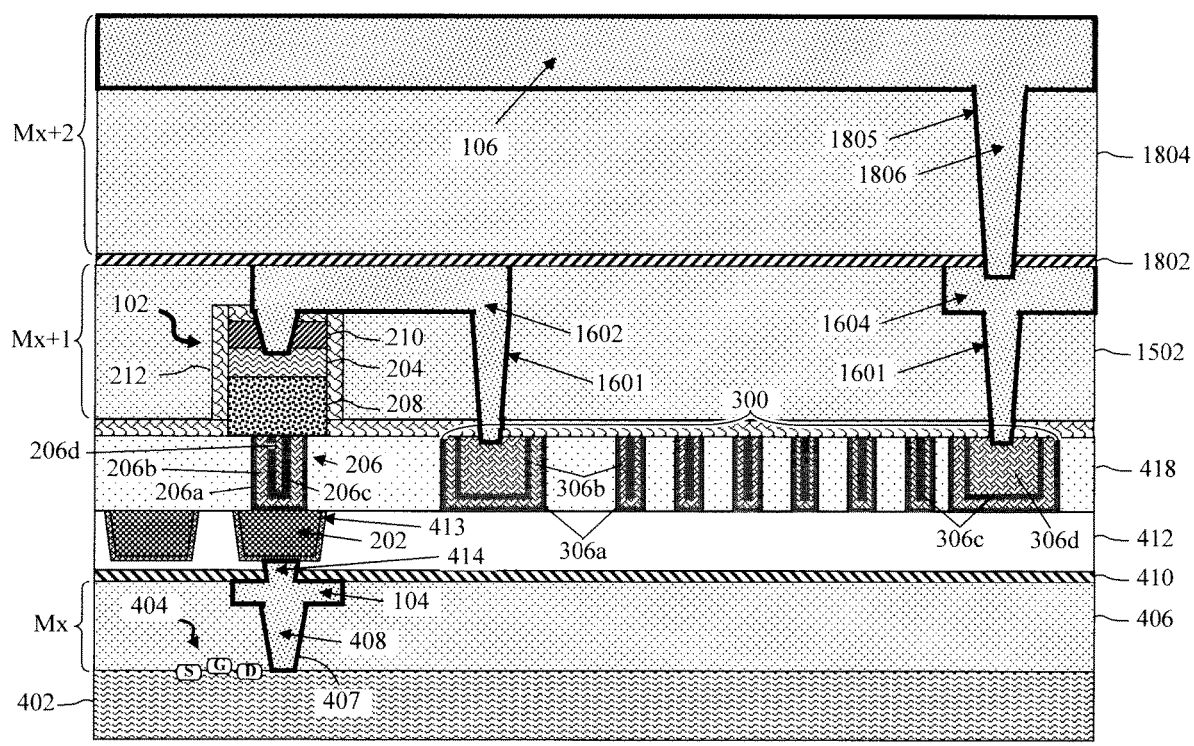
FIG. 18 is a cross-sectional diagram illustrating a third metal layer Mx+2 including the second metal line in a fourth ILD having been formed over the second metal layer Mx+1, whereby the second metal line is in contact with the second interconnect according to an embodiment of the present invention.

FIG. 17 is a top-down view of the structure (from view point E—see FIG. 16). As shown in FIG. 17, interconnect 1602 interconnects PCM cell 102 (of which only hardmask 210 is present in the top-down view) to the first end of the integrated series resistor 300. Interconnect 1604 is present over, and in contact with, the second/opposite end of integrated series resistor 300. For clarity, encapsulation layer 212 and ILD 1502 are not included in this depiction.

A third metal layer Mx+2 is then fabricated over the second metal layer Mx+1. To do so, a capping layer 1802 is first deposited onto the ILD 1502 over interconnects 1602 and 1604. See FIG. 18. Capping layer 1802 may also be referred to herein as the 'second capping layer' so as to distinguish it from 'first' capping layer 410. Suitable materials for the capping layer 1802 include, but are not limited to, nitride materials such as SiN, SiON and/or SiOCN. A process such as CVD, ALD or PVD can be employed to deposit the capping layer 1802 onto the ILD 1502. According to an exemplary embodiment, capping layer 1802 has a thickness of from about 2 nm to about 5 nm and ranges therebetween.

An ILD 1804 is then deposited onto the capping layer 1802 over interconnects 1602 and 1604. ILD 1804 may also be referred to herein as the 'fourth ILD' so as to distinguish it from 'first' ILD 406, 'second' ILD 412, and 'third' ILD 1502. Suitable materials for ILD 1804 include, but are not limited to, oxide materials such as SiOx and/or SiCOH and/or ULK-ILD materials such as pSiCOH. A process such as CVD, ALD or PVD can be employed to deposit ILD 1804 onto the capping layer 1802. Following deposition, ILD 1804 is polished using a process such as CMP.

A metallization process is then employed to form a second metal line 106 in ILD 1804. As described in conjunction with the description of FIG. 1 above, second metal lines 106 are present in memory array 100 above the PCM cells 102. In the exemplary embodiment shown illustrated in FIG. 18, a conductive via 1806 connects metal line 106 to interconnect 1604. As provided above, interconnect 1604 contacts an opposite end of the integrated series resistor 300 from interconnect 1602/PCM cell 102. Thus, via this configuration, resistor 300 is present in series with metal line 106 and PCM cell 102.

By way of example only, a so called 'dual damascene process' can be employed to form metal line 106 and conductive via 1806. As provided above, a dual damascene process involves first patterning features such as a trench and/or a via, and then filling the features with a metal or combination of metals (e.g., Cu, Co, Ru and/or W) using a process such as evaporation, sputtering or electrochemical plating to form metal lines and/or conductive vias, respectively. In this case, the features are patterned in ILD 1804 as well as capping layer 1802. Following deposition, the metal overburden can be removed using a process such as CMP. Prior to depositing the metal(s) into the features, a conformal barrier layer 1805 (e.g., Ta, TaN, Ti and/or TiN) can be deposited into and lining the features to prevent diffusion of the metal(s) into the surrounding dielectric. Additionally, a seed layer (not shown) can be deposited into and lining the features prior to contact metal deposition to facilitate plating of the metal(s) into the features.

In PCM devices 101, the resistance difference between the two states of PCM cells 102 (i.e., when phase change material 208 is in the amorphous state or in the crystalline state) may be orders of magnitude. The use of integrated series resistors 300 allows for the fine-tuning of the resistance value. For instance, as described above, the length of the integrated series resistors 300 can be tailored based on the position of the corresponding PCM device 101 in the memory array 100.

During programming of memory array 100, a SET operation is used to program one or more of the PCM cells 102 to a low resistance structural state representing a data value such as a logic '1' or a logic '0'. As provided above, the SET state is a low resistance structural state whose electrical properties are primarily controlled by the crystalline portion of the phase change material. The data values can be read from the memory array 100 during a read operation. A subsequent RESET operation is then used to return the PCM cells 102 to their previous high resistance structural state. As provided above, the RESET state is a high resistance structural state whose electrical properties are primarily controlled by the amorphous portion of the phase change material.

Heater 206 is employed to produce the heat (by resistive heating) used to switch phase change material 208 between the low resistance crystalline state and the high resistance amorphous state. To change a PCM cell 102 from the amorphous to the crystalline state, a SET programming voltage pulse is applied to heater 206 in order to heat the phase change material 208 above its crystallization temperature for a sufficiently long time. As a result, the phase change material 208 will arrange itself into a crystalline state during that heating time. To change the phase change material 208 from the crystalline state to the amorphous state, a RESET programming voltage pulse is applied to heater 206 in order to heat the phase change material 208 above its melting temperature and then quenched (quickly cooled). By this action, the phase change material 208 will not have time to rearrange itself in an ordered state, and the amorphous state will be the result. Both the crystallization temperature and melting temperature vary depending on the particular phase change material being employed.

During programming, as described above, there is a drop in the SET/RESET programming voltage pulses applied to the PCM cells 102 located along the same metal line. However, the integrated series resistors 300 can be adjusted to different lengths to accommodate for differences in distance from the programming voltage source. This leads to a uniform voltage drop amongst the PCM cells 102.

As compared to the SET/RESET programming voltage pulses, according to an exemplary embodiment the PCM cells 102 are read by applying a lower read voltage pulse for a shorter period of time. For example, the read voltage pulse can be less than either the SET or RESET programming voltage pulses. Further, reading has the read voltage applied for less than that of the SET or RESET times. For example, the read time can be less than half of the RESET time, and the read voltage pulse can be less than half of the SET programming voltage pulse. Furthermore, the RESET programming voltage pulse can be double or more the SET programming voltage pulse, and the SET time can be double, triple, 5 times, or more of the RESET time.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A phase change memory (PCM) device, comprising:
   at least one PCM cell comprising a phase change material disposed on a heater, wherein the heater is entirely below a bottommost surface of the phase change material of the at least one PCM cell;
   at least one resistor electrically connected in series with the at least one PCM cell, wherein the at least one resistor comprises a same combination of materials as the heater, wherein a top surface of the heater is coplanar with a top surface of the at least one resistor; and
   an electrical interconnect in direct contact with both a top electrode of the at least one PCM cell and an end of the at least one resistor.

2. The PCM device of claim 1, wherein the same combination of materials alternates between layers of a first material and a second material.

3. The PCM device of claim 2, wherein the first material is selected from the group consisting of: tantalum nitride (TaN) and silicon nitride (SiN), and wherein the second material comprises titanium nitride (TiN).

4. The PCM device of claim 1, wherein the phase change material is disposed directly on the top surface of the heater.

5. The PCM device of claim 1, wherein the phase change material comprises a chalcogenide alloy.

6. The PCM device of claim 1, wherein the at least one PCM cell further comprises:
   a bottom electrode on which the heater is disposed.

7. The PCM device of claim 1, further comprising:
   an encapsulation layer disposed on the at least one PCM cell and along sidewalls of the phase change material, and on the at least one resistor.

8. The PCM device of claim 7, wherein the encapsulation layer comprises a material selected from the group consisting of: silicon nitride (SiN), silicon oxynitride (SiON), silicon oxycarbonitride (SiOCN), and combinations thereof.

9. The PCM device of claim 1, wherein an entirety of the top surface of the heater directly contacts the bottommost surface of the phase change material of the at least one PCM cell.

10. The PCM device of claim 1, wherein a cross-sectional area of the at least one resistor is greater than a cross-section area of the heater.

11. The PCM device of claim 1, wherein a cross-sectional shape of the at least one resistor is different from a cross-section shape of the heater.

12. The PCM device of claim 1, further comprising:
    a hardmask layer, wherein an entire top surface of the hardmask layer is flush with both a top surface of the heater and a top surface of the resistor.

13. A memory array, comprising:
    a set of first metal lines;
    a set of second metal lines; and
    PCM devices in between the set of first metal lines and the set of second metal lines, wherein each of the PCM devices includes
       a PCM cell comprising a phase change material disposed on a heater, wherein the PCM cell is present at an intersection of the set of first metal lines and the set of second metal lines,
       a resistor in series with the PCM cell, wherein the resistor comprises a same combination of materials as the heater, wherein the resistor has a serpentine shape whereby at least a portion of the resistor loops back and forth along an x-direction and a y-direction,
       a hardmask layer separating the resistor from both the heater and the phase change material; and
       an interconnect in contact with both the PCM cell and an end of the resistor.

14. The memory array of claim 13, wherein the set of first metal lines is oriented orthogonal to the set of second metal lines.

15. The memory array of claim 13, wherein a length and a resistance of the resistor in each of the PCM devices is based on a position of each of the PCM devices in the memory array to provide a uniform voltage drop amongst the PCM devices such that there is at least a first PCM device at a first position in the memory array and a second PCM device at a second position in the memory array with the length and the resistance of the resistor in the first PCM device being different from the length and the resistance of the resistor in the second PCM device.

16. The memory array of claim 13, wherein a length and a resistance of the resistor in each of the PCM devices is based on a distance of each of the PCM devices from a voltage source such that there is at least a first PCM device at a first distance from the voltage source and a second PCM device at a second distance from the voltage source with the length and the resistance of the resistor in the first PCM device being different from the length and the resistance of the resistor in the second PCM device.

17. The memory array of claim 13, wherein the same combination of materials alternates between layers of a first material and a second material, wherein the first material is selected from the group consisting of: TaN and SiN, and wherein the second material comprises TiN.

18. The memory array of claim 13, wherein a top surface of the heater is coplanar with a top surface of the resistor and a top surface of the hardmask layer, and wherein the phase change material is disposed directly on both the top surface of the heater and the top surface of the hardmask layer.

19. The memory array of claim 13, wherein the phase change material comprises a chalcogenide alloy, and wherein the chalcogenide alloy comprises Te in combination with an element selected from the group consisting of: Sb, Ge, and combinations thereof.

20. A phase change memory (PCM) device, comprising:
  at least one PCM cell comprising a phase change material disposed on a heater; and
  at least one resistor electrically connected in series with the at least one PCM cell, wherein the at least one resistor comprises a same combination of materials as the heater, wherein the resistor has a serpentine shape whereby at least a portion of the resistor loops back and forth along an x-direction and a y-direction.

21. The PCM device of claim 20, wherein an entirety of a top surface of the heater directly contacts a bottom surface of the phase change material of the at least one PCM cell.

22. The PCM device of claim 20, wherein a cross-sectional area of the at least one resistor is greater than a cross-section area of the heater.

23. The PCM device of claim 20, wherein a cross-sectional shape of the at least one resistor is different from a cross-section shape of the heater.

24. The PCM device of claim 20, further comprising:
  a hardmask layer, wherein an entire top surface of the hardmask layer is flush with both a top surface of the heater and a top surface of the resistor.

* * * * *